(12) United States Patent
Doi et al.

(10) Patent No.: US 9,147,742 B2
(45) Date of Patent: Sep. 29, 2015

(54) HEAT TREATMENT APPARATUS AND SEMICONDUCTOR DEVICE MANUFACTURING METHOD

(75) Inventors: Hiroshi Doi, Chofu (JP); Masami Shibagaki, Fuchu (JP); Yuichi Sasuga, Minamitsuru-gun (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 1035 days.

(21) Appl. No.: 13/011,565

(22) Filed: Jan. 21, 2011

(65) Prior Publication Data

US 2011/0117753 A1 May 19, 2011

Related U.S. Application Data

(63) Continuation of application No. PCT/JP2010/004888, filed on Aug. 3, 2010.

(30) Foreign Application Priority Data

Aug. 4, 2009 (JP) ................................. 2009-181947

(51) Int. Cl.
| | |
|---|---|
| *H01L 21/26* | (2006.01) |
| *F27D 15/02* | (2006.01) |
| *H01L 29/66* | (2006.01) |
| *H01L 21/04* | (2006.01) |
| *H01L 21/67* | (2006.01) |
| *H01L 29/16* | (2006.01) |

(52) U.S. Cl.
CPC .......... *H01L 29/6606* (2013.01); *H01L 21/046* (2013.01); *H01L 21/67109* (2013.01); *H01L 21/67115* (2013.01); *H01L 29/1608* (2013.01)

(58) Field of Classification Search
USPC ................. 432/247, 249, 239, 242, 241, 120; 392/467; 219/667, 444.1; 438/509
See application file for complete search history.

(56) References Cited

U.S. PATENT DOCUMENTS

| 5,378,283 A | * | 1/1995 | Ushikawa | ..................... | 118/719 |
| 5,407,350 A | * | 4/1995 | Iwabuchi et al. | ............. | 432/241 |
| 5,433,784 A | * | 7/1995 | Miyagi et al. | ................. | 118/715 |

(Continued)

FOREIGN PATENT DOCUMENTS

| CN | 1604274 A | 4/2005 |
| CN | 101036220 A | 9/2007 |

(Continued)

OTHER PUBLICATIONS

Omegascope, Table of Total Emissivity, 1996, pp. 2 and 3.*

(Continued)

*Primary Examiner* — Steven B McAllister
*Assistant Examiner* — Steven Anderson, II
(74) *Attorney, Agent, or Firm* — Fitzpatrick, Cella, Harper & Scinto

(57) ABSTRACT

A heat treatment apparatus including a vacuum vessel, a substrate stage which holds a substrate mounted on it, a heating unit for heating the substrate, and an exhaust unit for evacuating the vacuum vessel includes a first reflector which covers the upper portion of the exhaust port of the exhaust unit while being spaced apart from the exhaust port, and a second reflector which surrounds the exhaust port. At least one of reflector members which form the second reflector faces a direction defined from the heating unit to the exhaust port.

12 Claims, 11 Drawing Sheets

(56) References Cited

U.S. PATENT DOCUMENTS

| | | | | |
|---|---|---|---|---|
| 5,445,521 | A | * | 8/1995 | Yamaguchi et al. ............... 432/5 |
| 5,513,499 | A | * | 5/1996 | deRijke .......................... 62/55.5 |
| 5,855,118 | A | * | 1/1999 | Lorimer ......................... 62/55.5 |
| 6,159,298 | A | * | 12/2000 | Saito ............................. 118/715 |
| 6,206,971 | B1 | * | 3/2001 | Umotoy et al. ................ 118/715 |
| 6,237,529 | B1 | * | 5/2001 | Spahn ........................... 118/726 |
| 7,039,303 | B2 | | 5/2006 | Kimura et al. |
| 7,091,453 | B2 | * | 8/2006 | Murayama et al. ........... 219/390 |
| 7,455,720 | B2 | * | 11/2008 | Gu ................................. 95/288 |
| 7,732,739 | B2 | | 6/2010 | Shibagaki et al. |
| 7,780,786 | B2 | * | 8/2010 | Mitsuhashi et al. .......... 118/715 |
| 8,150,243 | B2 | | 4/2012 | Kumagai et al. |
| 2002/0166632 | A1 | * | 11/2002 | Brezoczky et al. ........ 156/345.1 |
| 2003/0161733 | A1 | * | 8/2003 | Kabasawa et al. .............. 417/32 |
| 2009/0064944 | A1 | * | 3/2009 | Paine ........................ 122/14.22 |
| 2009/0190908 | A1 | | 7/2009 | Shibagaki |
| 2010/0006560 | A1 | | 1/2010 | Egami et al. |
| 2010/0151695 | A1 | | 6/2010 | Masaki et al. |
| 2010/0214777 | A1 | * | 8/2010 | Suehiro et al. ................ 362/235 |
| 2010/0226630 | A1 | | 9/2010 | Shibagaki |
| 2010/0243618 | A1 | | 9/2010 | Shibagaki et al. |

FOREIGN PATENT DOCUMENTS

| | | | |
|---|---|---|---|
| JP | 62-139987 A | | 6/1987 |
| JP | 63-33811 A | | 2/1988 |
| JP | 2-21616 A | | 1/1990 |
| JP | 2581955 B | | 11/1996 |
| JP | 9-199509 A | | 7/1997 |
| JP | 09199509 A | * | 7/1997 |
| JP | 2000-216095 A | | 8/2000 |
| WO | 2008/142747 A1 | | 11/2008 |
| WO | 2009-31450 A1 | | 3/2009 |

OTHER PUBLICATIONS

Office Action issued in Chinese Application No. 201080034385.3 dated Sep. 11, 2014 (6 pages).

Office Action issued in Chinese Application No. 201080034385.3 dated Jan. 20, 2014 (5 pages).

* cited by examiner

F I G. 4A
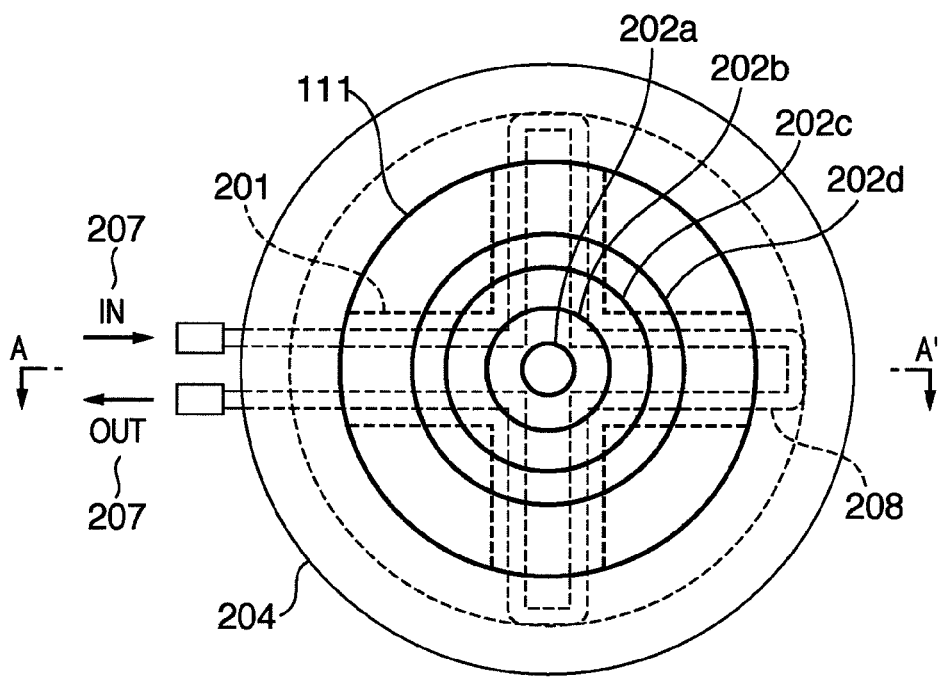
F I G. 4B
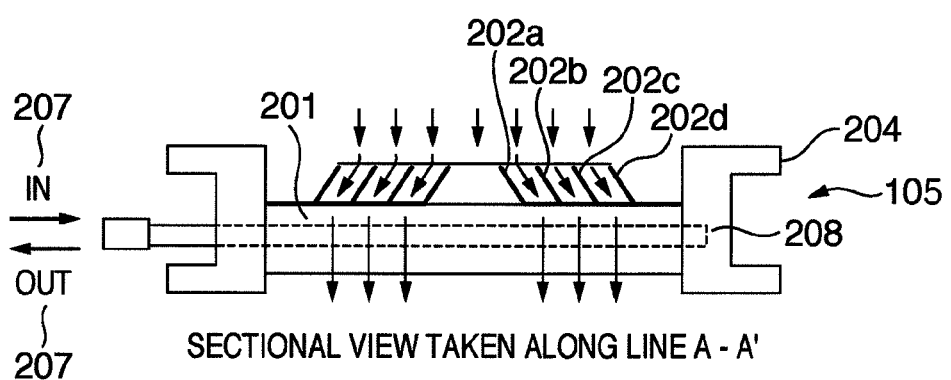
SECTIONAL VIEW TAKEN ALONG LINE A - A'

HEAT TREATMENT APPARATUS AND SEMICONDUCTOR DEVICE MANUFACTURING METHOD

CROSS-REFERENCE TO RELATED APPLICATION

This application is a continuation of International Application No. PCT/JP2010/004888, filed Aug. 3, 2010, which claims the benefit of Japanese Patent Application No. 2009-181947, filed Aug. 4, 2009. The contents of the aforementioned applications are incorporated herein by reference in their entirety.

TECHNICAL FIELD

The present invention relates to a heat treatment apparatus and a semiconductor device manufacturing method.

BACKGROUND ART

The semiconductor manufacturing technology often requires a process of rapidly heating/cooling a semiconductor substrate. Especially activation annealing of wide-bandgap semiconductors typified by silicon carbide (SiC) requires temperatures as high as about 2,000° C.

As a high-temperature heating apparatus, a heat treatment apparatus which is characterized by including a heating means in the upper portion of a vacuum vessel and in that a heat treatment is performed by radiant heat from the heating means while a substrate is mounted on a substrate holder having a lift lower portion has been proposed (PTL1).

In the heat treatment apparatus disclosed in PTL1, the substrate holder ascends in heating the substrate to shorten the distance between the heating means and the substrate, and descends after the heat treatment to separate the heat-treated substrate from the heating means and thereby cool the substrate. Moreover, the heat treatment apparatus described in PTL1 includes an exhaust port connected to a vacuum pump in order to evacuate the vacuum vessel to a vacuum atmosphere.

PTL2 discloses a heat treatment apparatus provided with an exhaust means without deteriorating the exhaust conductance. The heat treatment apparatus described in PTL2 has its one end connected to a rotary pump and its other end connected to a cryopump. Each of the cryopump and the rotary pump is connected to this apparatus via a heat treatment chamber and a valve. A water cooling baffle is provided between the valve and the heat treatment chamber, and a cryobaffle and a heat-shielding plate are provided between the cryopump and the valve.

CITATION LIST

Patent Literature

PTL1: International Publication No. WO2009/31450A
PTL2: Japanese Patent Laid-Open No. 62-139987

SUMMARY OF INVENTION

Technical Problem

However, in a heat treatment apparatus in which a heating chamber heats to high temperatures, as in PTL1, the temperature of the heating chamber must sufficiently drop prior to exhaust so as to prevent the vacuum pump from being damaged by the heat. On the other hand, to improve the productivity, after a heat treatment of one substrate is completed, the next substrate must be charged as early as possible. To meet this requirement, the means disclosed in PTL2 can be applied to the heat treatment apparatus disclosed in PTL1, but nonetheless the heat flowing into the exhaust port cannot be sufficiently shielded.

Solution to Problem

The present invention has been made in consideration of the above-mentioned problem, and has as its object to provide a heat treatment apparatus which does not inflict thermal damage on a vacuum pump without deteriorating the exhaust conductance.

In order to achieve the above-mentioned object, according to an aspect of the present invention, there is provided a heat treatment apparatus including a vacuum vessel, a substrate stage which holds a substrate mounted thereon, heating means for heating the substrate, and exhaust means for evacuating the vacuum vessel, comprising:

a first reflector which covers an upper portion of an exhaust port of the exhaust means while being spaced apart from the exhaust port; and a second reflector which surrounds the exhaust port, wherein at least one of reflector members which form the second reflector faces a direction defined from the heating means to the exhaust port.

According to another aspect of the present invention, there is provided a semiconductor device manufacturing method comprising the step of performing a heat treatment of a substrate using the above-mentioned heat treatment apparatus.

Advantageous Effects of Invention

According to an aspect of the present invention, it is possible to provide a heat treatment apparatus which does not inflict thermal damage on a vacuum pump.

According to another aspect of the present invention, a productivity high enough to manufacture a semiconductor device can be achieved because before the temperature of a heat-treated substrate sufficiently drops, a new substrate can be loaded after lowering a substrate holder and performing exhaust.

Especially because a substrate can be heat-treated at a high temperature, high-quality activation of an impurity implanted into silicon carbide (SiC) can be achieved while maintaining a sufficiently high productivity.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 4A is a view showing the detailed structure of the baffle provided with the water cooling mechanism;

FIG. 4B is a view showing the detailed structure of the baffle provided with the water cooling mechanism;

DESCRIPTION OF EMBODIMENTS

First Embodiment

Figure 1:
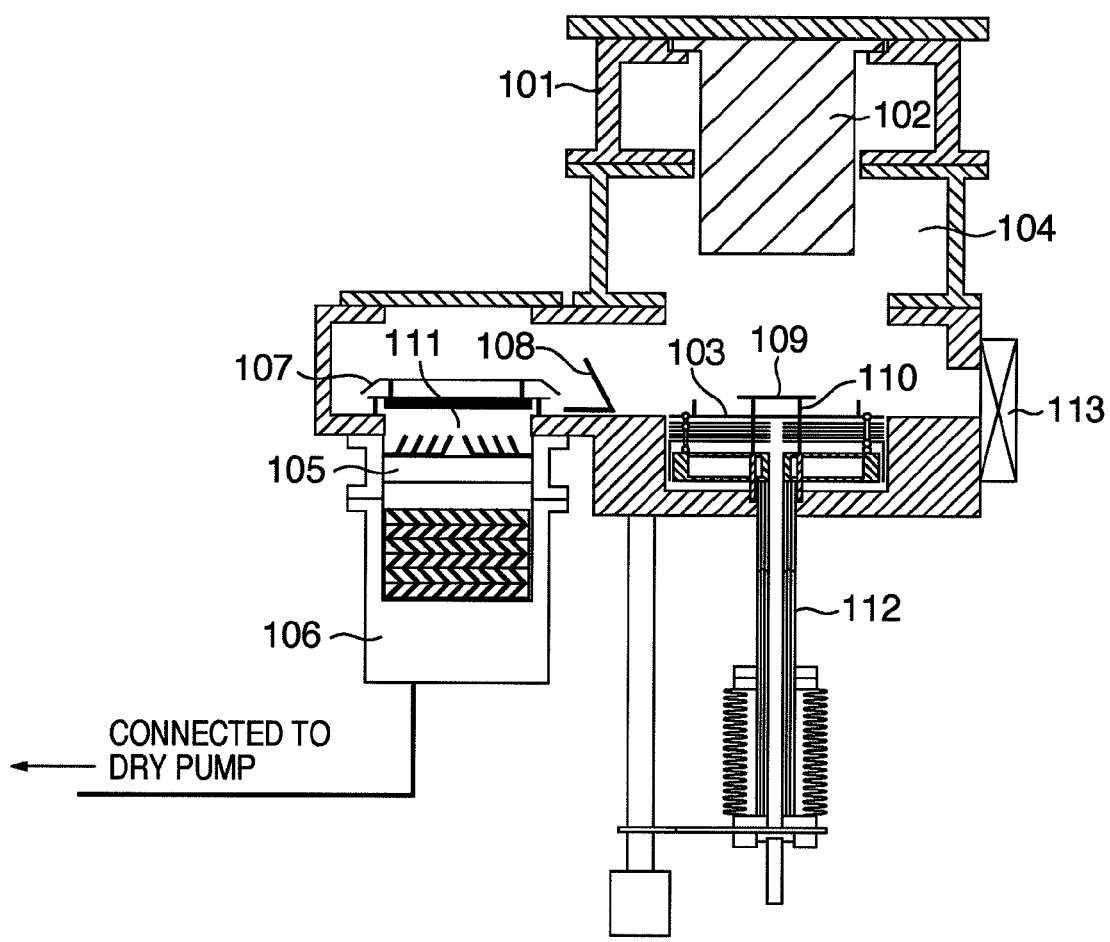
FIG. 1 is a view exemplifying the arrangement of a heat treatment apparatus according to the first embodiment of the present invention.

A heat treatment apparatus according to the first embodiment of the present invention will be described below with reference to the accompanying drawings. FIG. 1 is a view exemplifying the arrangement of a heat treatment apparatus according to the first embodiment of the present invention. A heating unit 102 and a substrate stage 103 are provided inside a vacuum vessel 101 to form a heating chamber 104. The vacuum vessel 101 also includes an exhaust port 111 which is connected to an exhaust system (exhaust means) in order to evacuate the vacuum vessel 101 to a vacuum atmosphere, and a slit valve 113 which opens/closes in loading or unloading a substrate. The exhaust port 111 is connected to a turbo-molecular pump 106 via a baffle 105 which is provided with a water cooling mechanism and functions as a cooling means. The turbo-molecular pump 106 is connected to a dry pump (not shown). A first reflecting plate (first reflector 107) and a second reflecting plate (second reflector 108) are disposed in the vicinities of the exhaust port 111.

The vacuum vessel 101 is heated to a temperature as high as about 1,700° C. or more by the heating unit 102, and therefore includes a housing made of a material which can withstand high temperatures, such as aluminum or stainless steel. Also, the surface of such a material preferably has a mirror finish. This is because heat reflection allows the interior of the heating vessel to more efficiently heat up. A water cooling channel (not shown) for the water cooling mechanism is provided in the wall of the vacuum vessel 101, and a coolant circulates through the water cooling channel (not shown) to make it possible to prevent the temperature in the housing of the vacuum vessel 101 from excessively rising.

A plurality of lift pin through holes within which a plurality of lift pins 110 can ascend or descend by means of a driving mechanism (not shown) is provided in the substrate stage 103. FIG. 1 shows the state in which the plurality of lift pins 110 standing upright in the bottom portion of the vacuum vessel 101 protrude upward from the substrate stage 103. The plurality of lift pins 110 are arranged at the positions, respectively, where they can support a substrate 109 at their distal ends. While the lift pins 110 protrude upward from the substrate stage 103, the substrate 109 transported into the vacuum vessel 101 by a substrate transport robot (not shown) is supported by the lift pins 110.

In the state shown in FIG. 1, when a substrate holder unit ascends and the substrate stage 103 moves to a position above the distal ends of the lift pins 110, the substrate 109 is mounted on the substrate mounting portion (not shown) of the substrate stage 103.

The substrate holder unit can ascend/descend by means of a lift device 112, and the distance between the substrate stage 103 and the heat radiating surface of the heating unit 102 can be controlled by the operation of the lift device 112. While the substrate 109 is kept in close proximity to the heating unit 102 upon ascent of the substrate holder unit, it is heated in a noncontact state by radiant heat from the heating unit 102. The heating unit 102 can be configured using, for example, a heater of the electron impact heating type, high-frequency induction heating type, or resistance heating type.

The heating temperature of the heating unit 102 is controlled to about 2,000° C. to perform a heat treatment of the substrate 109. After the heat treatment of the substrate 109 is completed, the lift device 112 lowers the substrate holder unit to the position (transport position) to which the substrate 109 is transported, and transfers the substrate 109 onto the lift pins 110. The substrate 109 is transported from the vacuum vessel 101 by a transport robot (not shown). FIG. 1 shows the state in which the substrate holder unit including the substrate stage 103 has moved to the transport position after the heating unit 102 is powered off.

(Layout Structure of Reflectors)

Figure 2A:
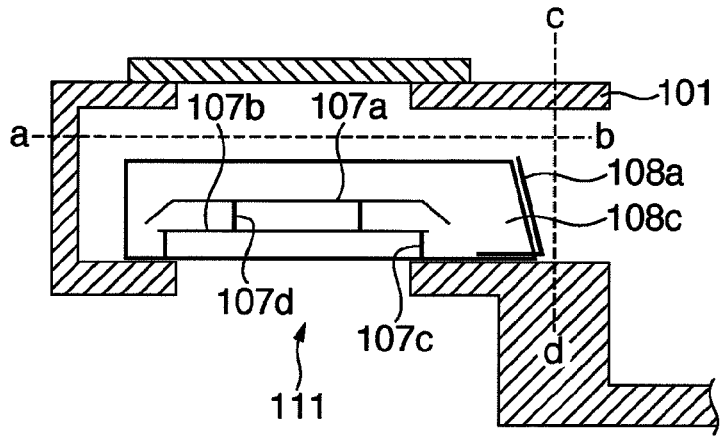
FIG. 2A is a schematic view showing the layout structure of reflectors disposed in the vicinities of an exhaust port.
Figure 2B:
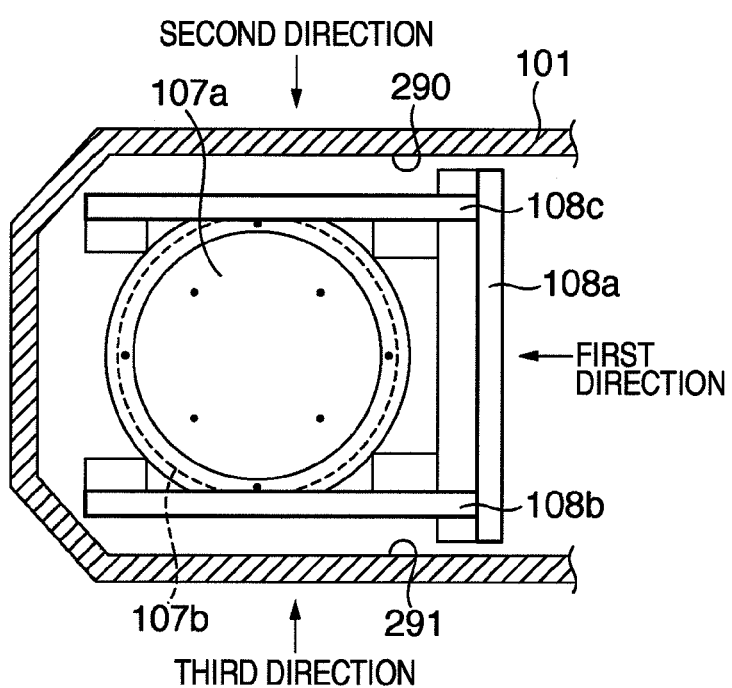
FIG. 2B is a schematic view showing the layout structure of the reflectors disposed in the vicinities of the exhaust port.
Figure 2C:
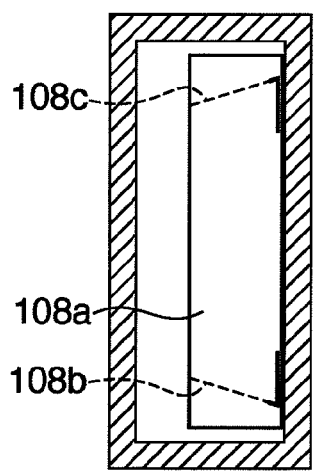
FIG. 2C is a schematic view showing the layout structure of the reflectors disposed in the vicinities of the exhaust port.

FIGS. 2A to 2C are schematic views showing the layout structure of the reflectors (first reflector 107 and second reflector 108) disposed in the vicinities of the exhaust port 111. FIG. 2A is a schematic sectional view, and FIG. 2B is a sectional view when a cross-section taken along a line a-b in FIG. 2A is viewed from above. FIG. 2C is a sectional view when a cross-section taken along a line c-d in FIG. 2A is viewed from the right side. The first reflector 107 and the second reflector 108 serve to reflect the radiant heat from the heating unit 102 to shield the heat flowing into the exhaust means from the heating unit 102.

In this embodiment, two types of reflectors are provided. The first reflector 107 includes first reflector members 107a and 107b which cover the upper portion of the opening of the exhaust port 111 while being spaced apart from the exhaust port 111. The first reflector member 107b is disposed while being spaced apart from the opening of the exhaust port 111 by a member 107c. The first reflector member 107a is disposed while being spaced apart from the first reflector member 107b by a member 107d.

The second reflector 108 includes the second reflector members 108a, 108b, and 108c which surround the exhaust port 111 (its outer periphery) from at least three directions. The second reflector member 108a is provided in the flow channel, through which the heating unit 102 communicates with the exhaust port 111, to face a first direction (FIG. 2A) defined from the heating unit 102 to the exhaust port 111. The second reflector member 108b is provided between the exhaust port 111 and one inner wall surface 290 of the vacuum vessel 101 to face a second direction (FIG. 2A) perpendicular to the first direction and the direction in which the first reflectors are stacked. The second reflector member 108c is provided between the exhaust port 111 and the other inner wall surface 291 of the vacuum vessel 101 to face a third direction (FIG. 2A) perpendicular to the first direction and the direction in which the first reflectors are stacked.

The first reflector 107 and second reflector 108 shown in FIGS. 2A to 2C can efficiently shield the heat entering the exhaust port 111 from the heating chamber 104. Examples of the heat entering the exhaust port 111 include heat which directly flows into the exhaust port 111 from the heating chamber 104, and heat which indirectly flows into the exhaust port 111 upon being reflected by the inner wall surfaces of the vacuum vessel 101. Especially when the vacuum vessel 101 is made of a metal with a high reflectance, such as aluminum, the heat reflected by the inner wall surfaces of the vacuum vessel 101 flows into the exhaust port 111 upon being repeatedly reflected by multiple reflection. In this embodiment, because the second reflector member 108a is provided in the passage (flow channel) through which the heating chamber 104 communicates with the exhaust port 111, the heat which directly flows into the exhaust port 111 from the heating chamber 104 can be shielded. Also, because the second reflector members 108b and 108c are opposed to the inner wall surfaces of the vacuum vessel 101, the heat which is indirectly guided into the exhaust port 111 upon being reflected by the inner wall surfaces of the vacuum vessel 101 can also efficiently be shielded.

Moreover, because the first reflector members 107a and 107b cover the exhaust port 111, the heat which is guided from the upper side of the exhaust port 111 and cannot be shielded by the second reflector members 108a, 108b, and 108c can also be shielded.

First reflector members 107a and 107b with a high heat absorbance and second reflector members 108a, 108b, and 108c with a high heat reflectance are more preferably used in combination. This is because the second reflector members 108a, 108b, and 108c reflect the heat, and the first reflector members 107a and 107b absorb the heat, thereby more efficiently shielding the heat. The first reflector members 107a and 107b and the second reflector members 108a, 108b, and 108c can be made of materials which can withstand high temperatures, such as carbon or a refractory metal. When the reflectors are made of a refractory metal such as aluminum, titanium, or molybdenum, the first reflector members 107a and 107b preferably undergo processing for enhancing the heat absorbance, such as blast processing, ceramics coating, or alumite processing.

The second reflector members 108a, 108b, and 108c preferably have a mirror finish. Among others, titanium which has undergone blast processing and has a high emissivity and a high high-temperature resistance is preferably used for the first reflector members 107a and 107b, and molybdenum or titanium which has undergone mirror finishing and has a low emissivity and a high high-temperature resistance is preferably used for the second reflector members 108a, 108b, and 108c.

Although the second reflectors surround the exhaust port from three directions in the above-mentioned example, they may surround the exhaust port from four directions. In this case, a reflector formed from a single plate may surround the exhaust port. Nevertheless, to ensure a given exhaust conductance, it is preferable to provide an appropriate gap (slit) in the side surface of that reflector or limit its height.

(Baffle Provided with Water Cooling Mechanism)

Figure 3:
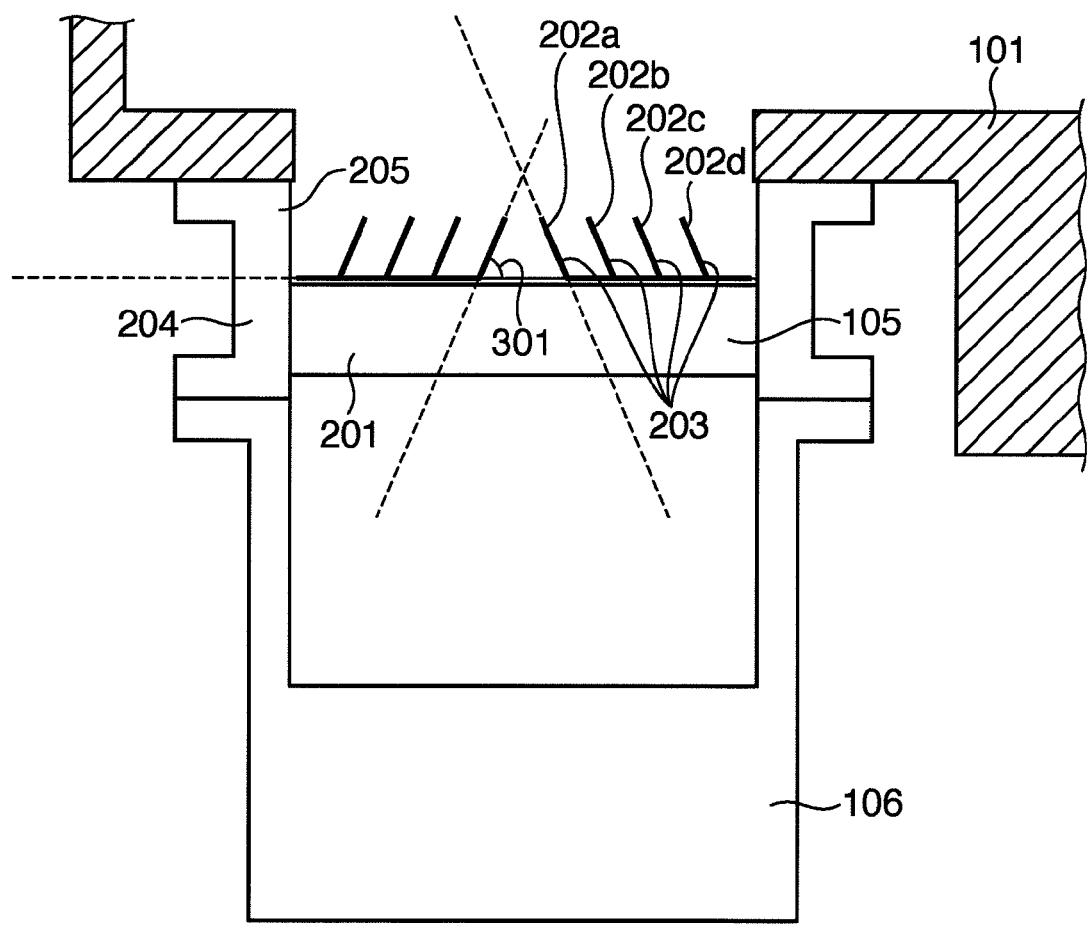
FIG. 3 is a schematic view showing the state in which a baffle provided with a water cooling mechanism is attached to a vacuum vessel.

FIG. 3 is a schematic view showing the state in which the baffle 105 which is provided with the water cooling mechanism and functions as a cooling means is attached to the vacuum vessel 101. FIGS. 4A and 4B show the detailed structure of the baffle 105 provided with the water cooling structure. FIG. 4A is a schematic view of the baffle 105 provided with the water cooling mechanism when viewed from the top surface. FIG. 4B is a schematic sectional view of the baffle 105 provided with the water cooling mechanism in a cross-section taken along a line A-A' in FIG. 4A. The baffle 105 provided with the water cooling mechanism includes a water cooling plate 201 and a combination of louvers 202a, 202b, 202c, and 202d provided on the water cooling plate 201. The louvers 202a, 202b, 202c, and 202d are attached to the water cooling plate 201. The louvers 202a, 202b, 202c, and 202d are made of, for example, stainless steel, have a truncated cone shape as a whole, and are formed by seamless integration using, for example, a 1-mm thick plate. The radiant heat is reflected by the louvers 202a, 202b, 202c, and 202d so as to be prevented from flowing downstream of the exhaust port 111. At this time, the louvers 202a, 202b, 202c, and 202d are cooled by the water cooling plate 201 because they heat upon receiving the radiant heat. This makes it possible to suppress a rise in temperature of the exhaust port 111, thus protecting the turbo-molecular pump 106 against the radiant heat.

In attaching the louvers 202a, 202b, 202c, and 202d onto the water cooling plate 201, a total of four louvers (the louvers 201a, 201b, 201c, and 202d) with adjusted sizes are used so that they can be concentrically arrayed with arbitrary spacings between them. The surface of the baffle 105 provided with the water cooling mechanism preferably has undergone mechanical processing or chemical processing so that the surface emissivity of the baffle 105 on the side of the heating unit 102 (on the side of the heating means) becomes 0.02 (inclusive) to 0.3 (inclusive). Also, at least one of a material having undergone a black alumite treatment, pyrolytic carbon, graphite coated with pyrolytic carbon, glassy carbon, and graphite coated with glassy carbon is preferably attached onto the surface of the baffle 105 so that the surface emissivity of the baffle 105 on the side of the exhaust means (on the side of the turbo-molecular pump 106) becomes 0.5 (inclusive) to 1.0 (inclusive).

The emissivities of the upper and lower surfaces of each louver are both preferably set to 0.3 (inclusive) to 0.6 (inclusive). Although four louvers are used in this embodiment, the scope of the present invention is not limited to this example, and an optimum number of louvers can be appropriately designed.

Surfaces 203 of the louvers 202a, 202b, 202c, and 202d on the side of the heating unit 102 have a mirror finish, and can reflect the radiant heat from the heating unit 102. Each of the louvers 202a, 202b, 202c, and 202d makes a predetermined angle 301 with the water cooling plate 201 so that the exhaust port 111 cannot be optically seen from the heating unit 102. The angle 301 can take values from 1° to 89° and is 45° in this embodiment.

The water cooling plate 201 is made of, for example, stainless steel, in which a plate portion and a water channel are integrally molded. As shown in FIG. 4A, the water cooling plate 201 has a cruciform outer shape, and a water channel 208 provided inside it has, for example, a cruciform structure in which cooling water can circulate from the IN side to the OUT side.

To optimize heat transfer between the water cooling plate 201 and the louvers 202, an indium (In) sheet (not shown) is inserted between them. With the foregoing arrangement, the entire baffle 105 provided with the water cooling mechanism can be cooled by a coolant such as cooling water 207 supplied to the water channel 208. A cylinder tube portion (tube-shaped member) 204 of the baffle 105 provided with the water cooling mechanism can hold the water cooling plate 201, and is integrally molded with the water cooling plate 201 by cutting it out from a stainless block. The cylinder tube portion 204 has a thick structure with which even if the turbo-molecular pump 106 suddenly stops, deformation and damage are prevented from occurring on the side walls of the cylinder tube portion 204 by the reaction force of the stop. When the vacuum vessel 101 is formed using aluminum, its thickness preferably is 10 [mm] or more. The turbo-molecular pump 106 used in this embodiment has, for example, an exhaust rate of 1,300 [L/sec] and a torque of 26,000 [N·m] acting upon sudden stop. The turbo-molecular pump 106 generates a maximum stress of 132 [N/mm$^2$], which satisfies a safety factor of 2 or more. When the second reflector members 108a, 108b, and 108c and the baffle 105 provided with the water cooling mechanism are mounted in the heat treatment apparatus, its exhaust conductance slightly deteriorates but its achieved degree of vacuum is maintained on the order of 1×10E−5 [Pa], and this means that its exhaust performance is sufficiently high.

Note that the cylinder tube portion 204 is not limited to an arrangement obtained by cutting it out from a stainless block. For example, to make active use of radiation cooling, the flow of heat into the exhaust system can also further be prevented by mounting a carbon sheet (not shown) or a carbon plate (not shown) onto side wall inner surfaces 205 of the cylinder tube portion 204 or applying a silicon-based coating onto the side wall inner surfaces 205 so that the emissivity of the side wall inner surfaces 205 becomes 0.5 (inclusive) to 1.0 (inclusive).

(Modification of Layout Structure of Reflectors)

Figure 5A:
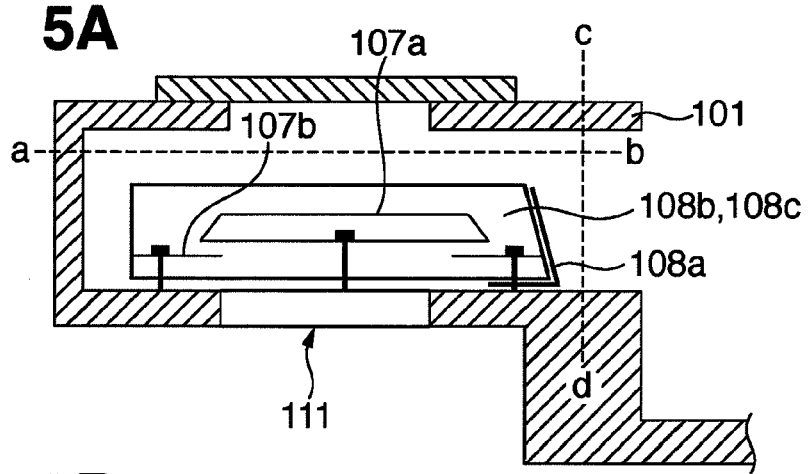
FIG. 5A is a view showing the first modification of the layout structure of reflectors.
Figure 5B:
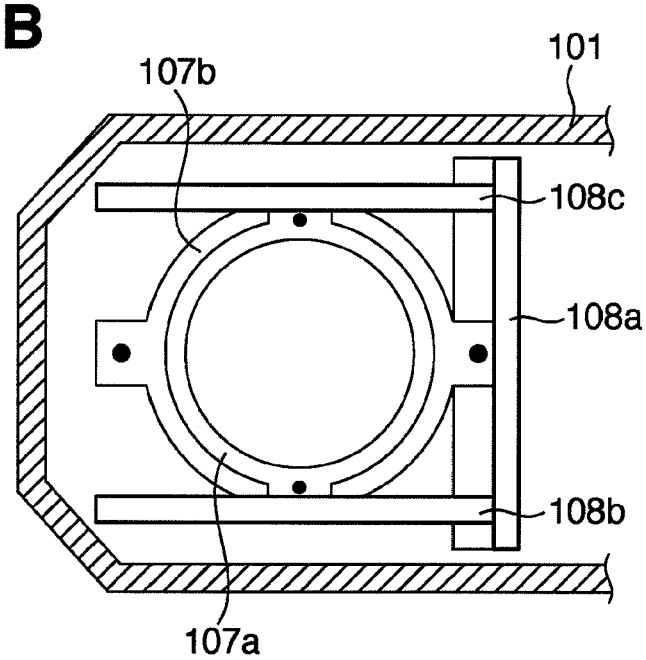
FIG. 5B is a view showing the first modification of the layout structure of the reflectors.
Figure 5C:
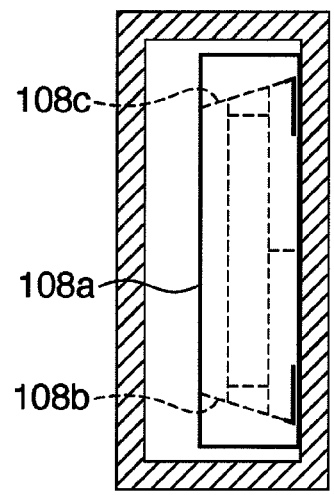
FIG. 5C is a view showing the first modification of the layout structure of the reflectors.

Although the first reflector members 107a and 107b are fixed in the vacuum vessel 101 separately from the second reflector members 108a, 108b, and 108c in the layout structure of the reflectors described with reference to FIGS. 2A to 2C, they may be fixed on the second reflector members 108b and 108c. FIGS. 5A to 5C are views showing the first modification of the layout structure of reflectors. FIG. 5A is a schematic sectional view, and FIG. 5B is a sectional view when a cross-section taken along a line a-b in FIG. 5A is viewed from above. FIG. 5C is a sectional view when a cross-section taken along a line c-d in FIG. 5A is viewed from the right side. In the first modification shown in FIGS. 5A to 5C, disk-shaped, first reflector members 107a and 107b are fixed on second reflector members 108a, 108b, and 108c.

Figure 6:
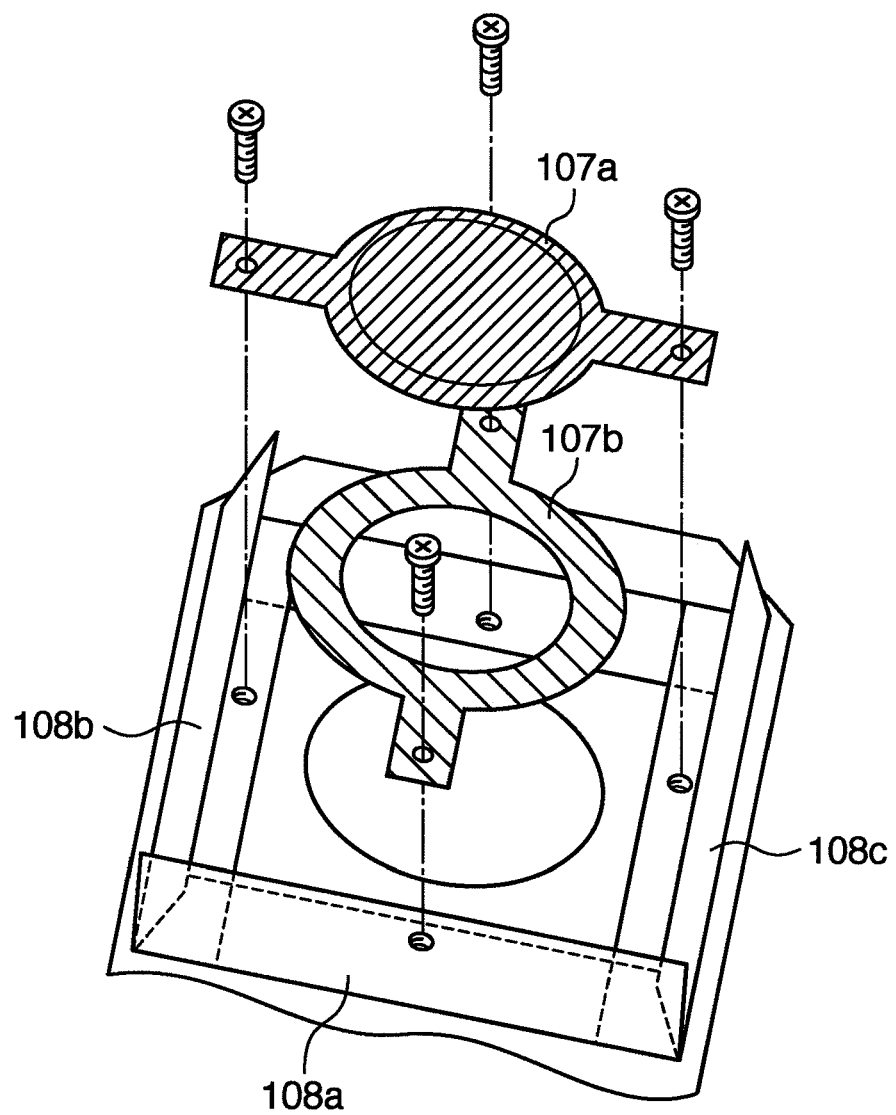
FIG. 6 is a view showing the first modification of the layout structure of the reflectors.

The attachment state of the first reflector members 107a and 107b will be described with reference to FIG. 6. The first reflector member 107a is fixed on the second reflector members 108b and 108c. The first reflector member 107b is fixed on the second reflector member 108a.

Figure 7A:
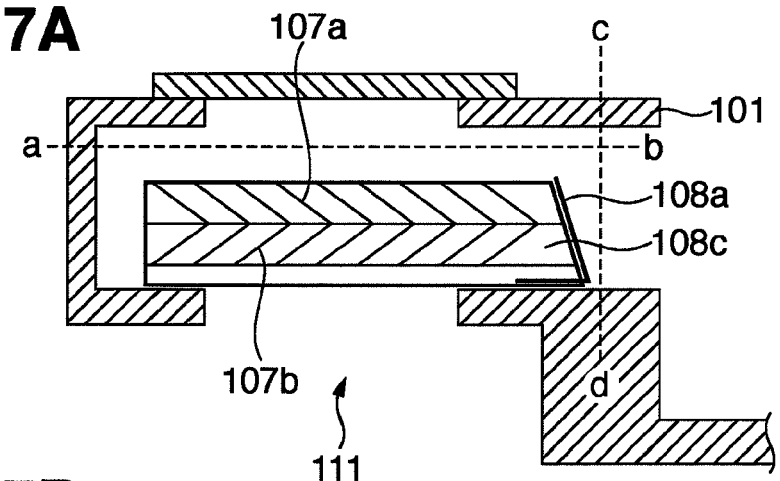
FIG. 7A is a view showing the second modification of the layout structure of reflectors.
Figure 7B:
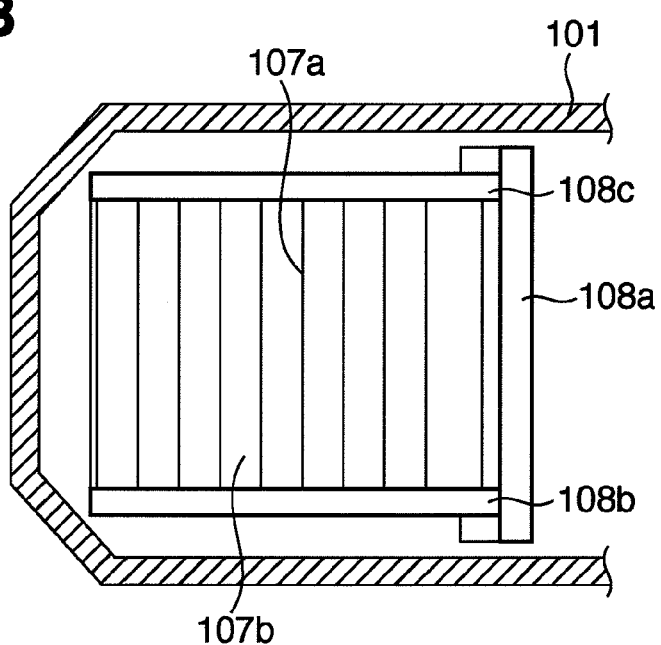
FIG. 7B is a view showing the second modification of the layout structure of the reflectors.
Figure 7C:
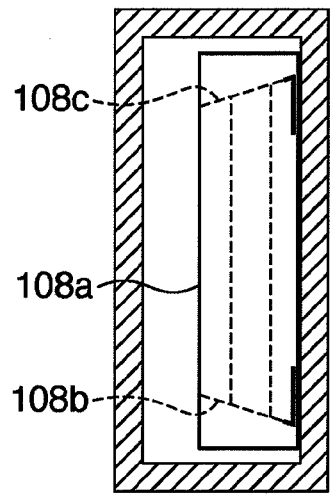
FIG. 7C is a view showing the second modification of the layout structure of the reflectors.

FIGS. 7A to 7C are views showing the second modification of the layout structure of reflectors. FIG. 7A is a schematic sectional view, and FIG. 7B is a sectional view when a cross-section taken along a line a-b in FIG. 7A is viewed from above. FIG. 7C is a sectional view when a cross-section taken along a line c-d in FIG. 7A is viewed from the right side. In the second modification shown in FIGS. 7A to 7C, rectangular plate-like first reflector members 107a and 107b are fixed on second reflector members 108a, 108b, and 108c. The first reflector members 107a and 107b are provided between the second reflector members 108b and 108c with predetermined spacings between them. Also, the first reflector members 107a and 107b are obliquely tilted with respect to the opening of the exhaust port 111. Because the first reflector members 107a and 107b also have vertical spacings on and beneath them, the heat entering from an upper position can be shielded. The second modification is preferable, according to which the radiant heat (light) can be effectively shielded without significantly lowering the exhaust rate by providing a heat-absorbing region and a heat-reflecting region.

Figure 8A:
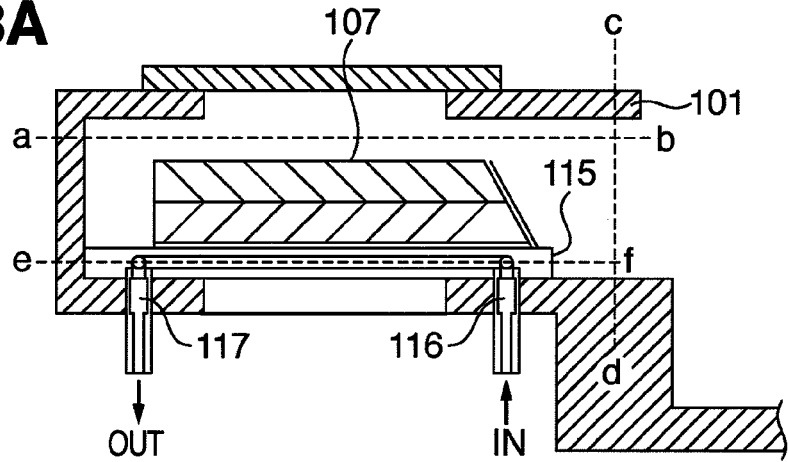
FIG. 8A is a view showing the third modification of the layout structure of reflectors.
Figure 8B:
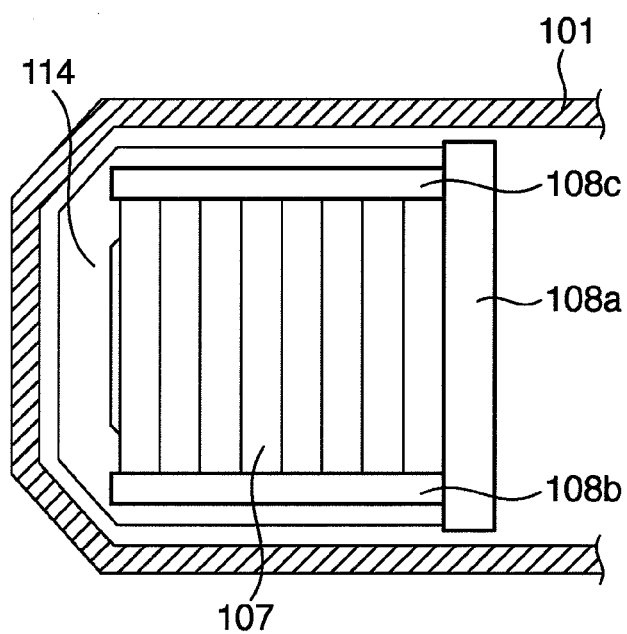
FIG. 8B is a view showing the third modification of the layout structure of the reflectors.
Figure 8C:
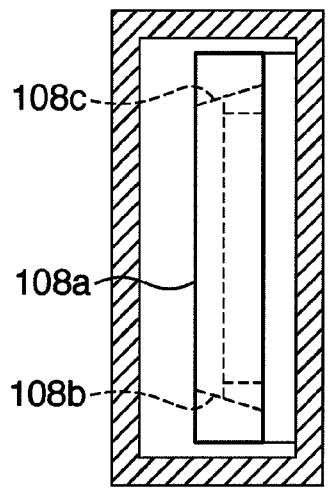
FIG. 8C is a view showing the third modification of the layout structure of the reflectors.
Figure 9:
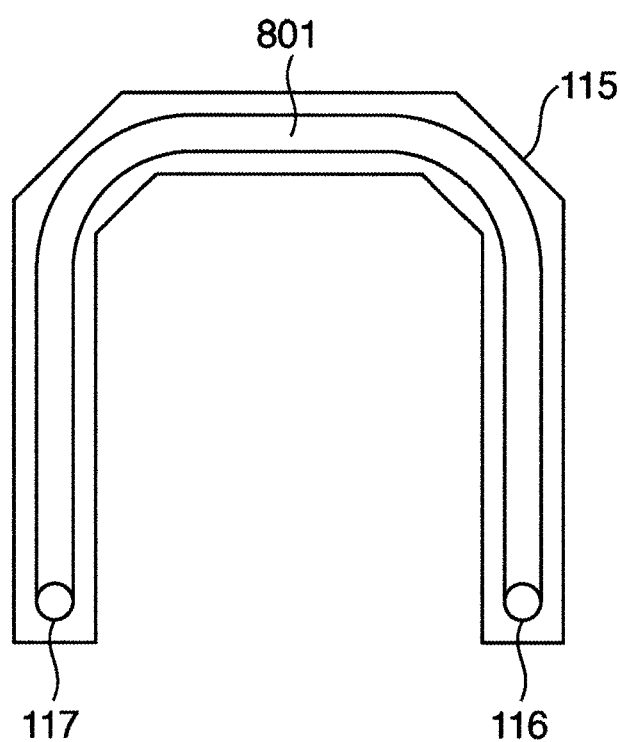
FIG. 9 is a view showing the structure of a water cooling plate 115 when viewed from a position above a cross-section taken along a line e-f in FIG. 8A.

FIGS. 8A to 8C are views showing the third modification of the layout structure of reflectors. FIG. 8A is a schematic sectional view, and FIG. 8B is a sectional view when a cross-section taken along a line a-b in FIG. 8A is viewed from above. FIG. 8C is a sectional view when a cross-section taken along a line c-d in FIG. 8A is viewed from the right side. In the third modification, a water cooling plate 115 is provided between the exhaust port 111 and the first reflector members 107a and 107b and second reflector members 108a, 108b, and 108c in the second modification. FIG. 9 is a view showing the structure of the water cooling plate 115 when viewed from a position above a cross-section taken along a line e-f in FIG. 8A. A water inlet 116 and a water outlet 117 are provided in the water cooling plate 115, and a coolant such as water is supplied from the water inlet 116 and recovered from the water outlet 117 upon circulating through a flow channel 801, as shown in FIG. 9. The first reflector members 107a and 107b and second reflector members 108a, 108b, and 108c are cooled by the water cooling plate 115, thereby making it possible to drop the temperature of the heat flowing into the exhaust port 111.

According to an aspect of this embodiment, it is possible to provide a heat treatment apparatus which does not inflict thermal damage on a vacuum pump.

According to another aspect of this embodiment, a productivity high enough to manufacture a semiconductor device can be achieved because before the temperature of a heat-treated substrate sufficiently drops, a new substrate can be loaded after lowering a substrate holder and performing exhaust.

Second Embodiment

Figure 10:
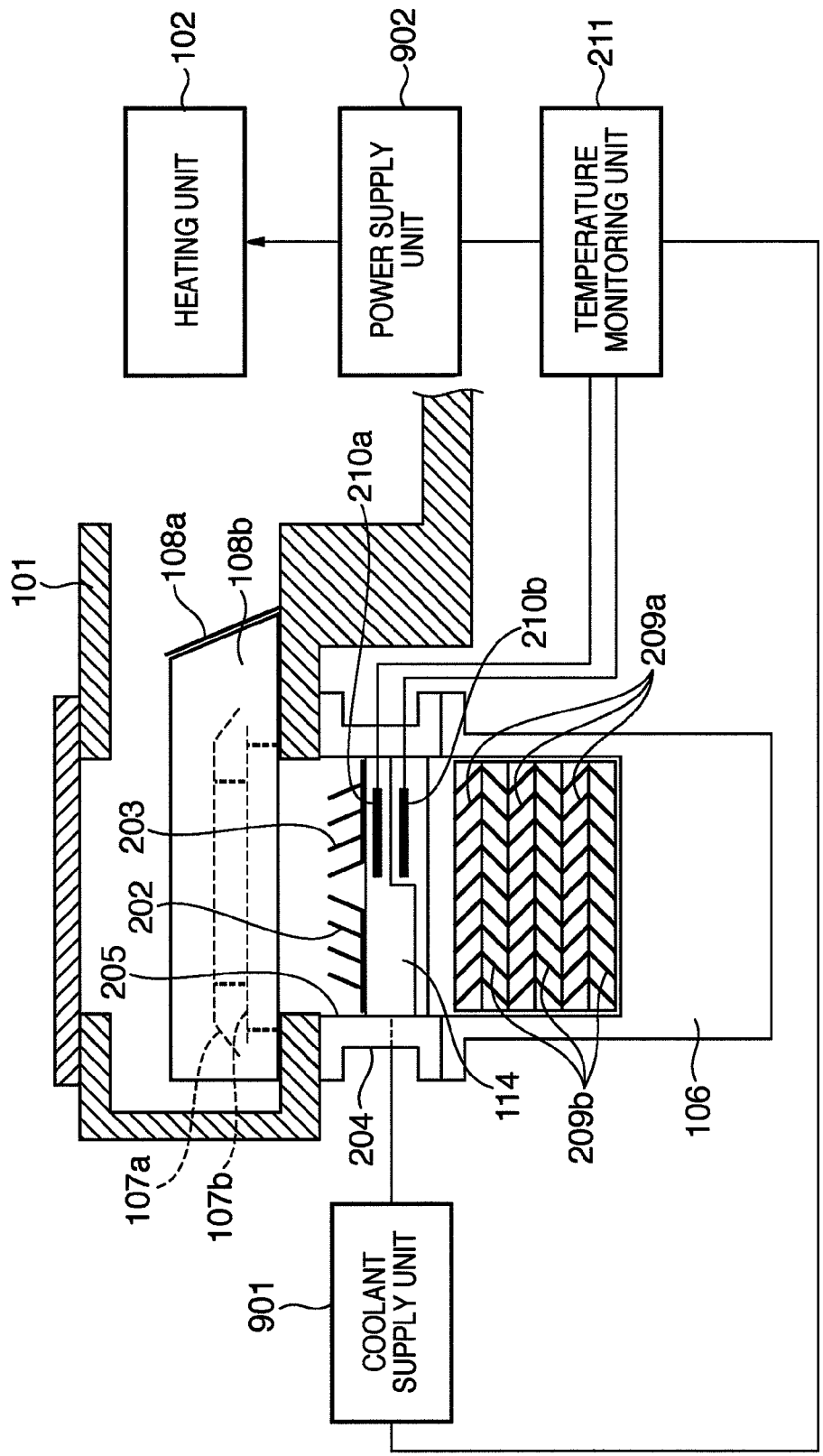
FIG. 10 is a view showing an example of the arrangement of a heat treatment apparatus according to the second embodiment of the present invention.

FIG. 10 is a view showing an example of the arrangement of a heat treatment apparatus according to the second embodiment of the present invention. The heat treatment apparatus shown in FIG. 10 is the same as that shown in FIG. 1 except that the former includes thermocouples 210a and 210b and a temperature monitoring unit 211.

The thermocouple 210a (first temperature detection unit) is provided on a water cooling plate 114, and detects the temperature of the water cooling plate 114. The thermocouple 210b (second temperature detection unit) is provided in the space between a turbo-molecular pump 106 and a baffle 105 provided with a water cooling mechanism, and detects the temperature of the space region between the turbo-molecular pump 106 and the baffle 105 provided with the water cooling mechanism. The thermocouples 210a and 210b are connected to the temperature monitoring unit 211. The temperature monitoring unit 211 can perform temperature control so that the temperature in a vacuum vessel 101 becomes constant.

Based on the detection result obtained by the thermocouple 210a, when the temperature of the water cooling plate 114 rises and reaches a predetermined temperature (first detection temperature) determined in advance, the temperature monitoring unit 211 raises the flow rate of water supplied to the water cooling plate 114 in order to enhance the cooling capacity, thereby controlling the temperature of the water cooling plate 114 constant. Based on the detection result obtained by the thermocouple 210b, when the temperature in the space between the pump and the water cooling baffle rises in excess of a predetermined temperature (second detection temperature), the temperature monitoring unit 211 stops power supply to a heating unit 102, thereby performing temperature control so as to prevent a further rise in temperature in the vacuum vessel.

When the temperature detected by the thermocouple 210a rises to the first detection temperature determined in advance, the temperature monitoring unit 211 controls a coolant supply unit 901 to raise the flow rate of water supplied to the water cooling plate 114, thereby controlling the temperature of the water cooling plate 114 constant.

When the temperature detected by the thermocouple 210b rises to the second detection temperature determined in advance, the temperature monitoring unit 211 controls a power supply unit 902 to stop power supply to the heating unit 102, thereby performing temperature control so as to prevent a further rise in temperature in the vacuum vessel 101.

Example

When a substrate 109 was heat-treated at 2,000° C. by the heat treatment apparatus described with reference to FIG. 1, the cooling standby time was set to 5 min, and the heat-treated substrate 109 was unloaded, no thermal influence was exerted on the exhaust system. The same result was obtained as well when the heat treatment apparatus according to the second embodiment was used.

In the conventional arrangement, the exhaust system was influenced by a thermal effect produced upon a heat treatment at a temperature close to 2,000° C. In contrast to this, in the heat treatment apparatus according to the present invention, heat generated upon heat radiation was appropriately radiated or absorbed by a baffle 105 provided with a water cooling mechanism to reduce radiant heat which had high temperatures and reached the exhaust system, thereby making it possible to suppress a rise in temperature of the exhaust system. When, for example, the temperature of cooling water supplied to the baffle 105 provided with the water cooling mechanism was set to 20° C., the temperature in the vicinity of the intake port of a turbo-molecular pump 106 could be kept at 50° C., which is considerably lower than 120° C. beyond which the turbo-molecular pump 106 is damaged.

It is more effective to control the temperature of cooling water using a chiller (temperature monitoring unit) and supply the cooling water to the baffle 105 provided with the water cooling mechanism, thus making it possible to improve even the reliability of the heat treatment apparatus. When the time taken to unload the heat-treated substrate 109 was evaluated using the heat treatment apparatus, the evaluation result revealed that the present invention can shorten this time to 3 min, which is 1/10 that in the prior art. This makes it possible to dramatically speed up the heat treatment, thus improving the mass productivity.

Figure 11:
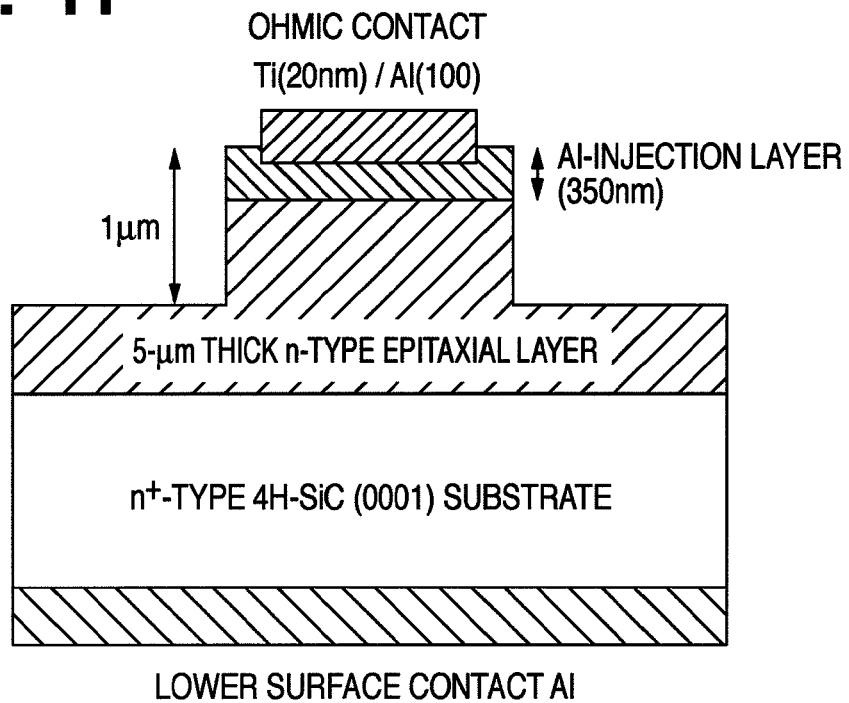
FIG. 11 is a sectional view of a $p^+n$ junction diode.

An example in which annealing was performed using the heat treatment apparatus, and a p$^+$n junction diode which had a cross-sectional shape as shown in FIG. 11 was fabricated by ion implantation will be given.

A 5-μm thick epitaxial layer was formed by sacrificial oxidation on an n$^+$-type 4H—SiC (0001) substrate with an off-angle of 4°, and underwent a hydrofluoric acid treatment. After that, an ion implantation device implanted nitrogen into the SiC substrate by the multistep method within the implantation energy range of 30 keV to 170 keV so that the nitrogen was implanted at a temperature of 500° C., a depth of 350 nm, and a concentration of $3 \times 10^{20}/cm^3$. The thus obtained SiC substrate was set as a substrate sample and heat-treated using the heat treatment apparatus according to the first or second embodiment of the present invention.

The substrate sample was mounted on a substrate stage 103 with its ion-implanted surface facing up (facing the side of the heat radiating surface of a heating unit 102), the interval between the heat radiating surface of the heating unit 102 and the surface, into which nitrogen ions were implanted, of the sample was set to 3 mm, the temperature of the heat radiating surface at the time of heating was set to 1,900° C., and the sample was annealed by heating for 1 min in a reduced pressure atmosphere of $10^{-4}$ Pa.

Next, each annealed sample was sacrificially oxidized and cleaned using hydrofluoric acid to remove any surface deterioration layer formed on it. Further, after each sample was patterned using silicon oxide, the SiC layer was etched to have a diameter of 100 μm and a depth of 1 μm using an RIE (Reactive Ion Etching) device in an atmosphere of $CF_4+Ar$ mixture gas, thereby forming a mesa.

Using a vacuum deposition device, titanium (Ti) was deposited by 20 nm, aluminum (Al) was deposited by 100 nm, and the sample was annealed for 3 min at 900° C. in an annealing furnace in an argon (Ar) gas atmosphere, thereby forming an ohmic electrode. To evaluate the characteristic of the obtained diode, its current density vs. voltage characteristics were measured using "Keithley 4200" at room temperature.

Figure 12:
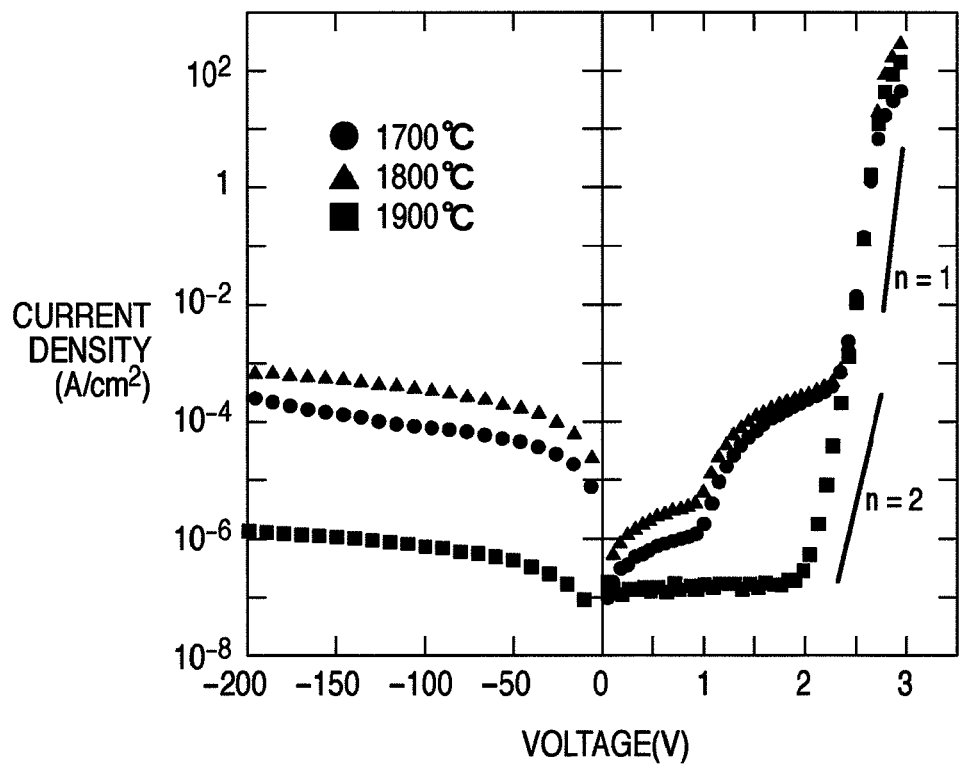
FIG. 12 is a graph showing the dependence of the current density vs. voltage characteristic of the $p^+n$ junction diode on the annealing temperature.

FIG. 12 shows the current density vs. voltage characteristics of the annealed p$^+$n diode when the annealing temperature was 1,700° C., 1,800° C., and 1,900° C. At annealing temperatures of 1,700° C. and 1,800° C., high leakage current densities were measured at forward voltages of 0 V to 2 V. In contrast to this, almost no leakage current density values were measured in the reverse voltage range, and only very small leakage current density values on the order of $10^{-6}$ A were measured even in the forward voltage range. The inventor of the present invention examined the cause of these measurement results, and surmised that crystal defects generated upon ion implantation into the pn junction interface disappeared as a result of a high-temperature treatment at an annealing temperature of 1,900° C.

In this manner, a p$^+$n junction diode with a very good performance can be fabricated using the heat treatment apparatus according to the first or second embodiment of the present invention. Such a pn junction is utilized not only for a pn junction diode but also for a field-effect transistor (MOSFET), a junction transistor (J-FET), a MES-FET, and a bipolar transistor (BJT). This junction can improve the characteristics of these semiconductor devices that use SiC, and, in turn, can dramatically improve the productivity.

The present invention especially allows a high-temperature treatment of a substrate, thus achieving high-quality activation of an impurity implanted into silicon carbide (SiC).

The present invention is not limited to the above-described embodiments, and various changes and modifications can be made within the spirit and scope of the present invention. Therefore, to apprise the public of the scope of the present invention, the following claims are made.

The invention claimed is:

1. A heat treatment apparatus including a vacuum vessel, a substrate stage which is constructed in the vacuum vessel and holds a substrate mounted thereon, a heating unit which is constructed so as to face the substrate stage in the vacuum vessel and is constructed to heat the substrate, and an exhaust unit constructed to evacuate, via an exhaust port, the vacuum vessel having a first region in which the heating unit is constructed and a second region in which the exhaust port communicating with the exhaust unit and the substrate stage capable of moving by a lift unit are constructed comprising:

a first reflector constructed in the second region to cover a vertical upper part of an inlet of the exhaust port while being spaced apart from the exhaust port, and shield heat output from the heating unit, and a second reflector constructed to partially surround the exhaust port in a direction perpendicular to an axis of the exhaust port, and shield the heat output from the heating unit, wherein, in a case where the heating unit heats the substrate held on the substrate stage, the substrate stage is moved by the lift unit in a direction toward the heating unit and the substrate stage is positioned at a position where heat output from the heating unit is shielded by the substrate stage in the first region, and wherein, in a case where the heating unit completes the heating of the substrate, the substrate stage is moved by the lift unit in a direction away from the heating unit, and the first reflector and the second reflector shield the heat output from the heating unit in the second region so as to prevent the heat output from the heating unit from directly flowing into the exhaust port, wherein a member is constructed between the first region and the second region, the member is constructed to have an opening of diameter which is equal to or greater than a diameter of the substrate stage, and the member is constructed so as to project from a side wall of the vacuum vessel into an internal space of the vacuum vessel, wherein, in a case where the substrate stage is moved by the lift unit in a direction toward the heating unit and the substrate stage is positioned at the opening, the first region and the second region are separated by the substrate stage and the member, and a heating chamber is configured by the separated first region, wherein the second reflector comprises a plurality of reflector members, and the plurality of reflector members includes:

a first reflector member which is provided in a flow channel, through which a heating chamber in which the substrate is heated by the heating unit communicates with the exhaust port, to face a first direction defined from the heating unit to the exhaust port;

a second reflector member which is provided between the exhaust port and one inner wall surface of the vacuum vessel to face a second direction perpendicular to the first direction and a direction in which said first reflector is arranged; and a third reflector member which is provided between the exhaust port and the other inner wall surface of the vacuum vessel to face a third direction perpendicular to the first direction and the direction in which said first reflector is arranged, and wherein the first reflector is located within a space defined by the second reflector.

2. The heat treatment apparatus according to claim 1, wherein said second reflector is made of a material selected from the group consisting of molybdenum and titanium having a mirror finish.

3. The heat treatment apparatus according to claim 1, wherein said first reflector has undergone at least one of blast processing, ceramics coating, and alumite processing.

4. The heat treatment apparatus according to claim 1, further comprising:

a cooling unit constructed to include a water cooling plate, a louver provided in a vertical upper portion of said water cooling plate, and a tube-shaped member used to hold said water cooling plate, wherein said cooling unit is provided between the exhaust unit and the exhaust port.

5. The heat treatment apparatus according to claim 4, wherein a surface of said cooling unit has undergone mechanical processing or chemical processing so that a surface emissivity of said cooling unit on a side of the heating unit becomes 0.02 (inclusive) to 0.3 (inclusive).

6. The heat treatment apparatus according to claim 4, wherein at least one of a material having undergone a black alumite treatment, pyrolytic carbon, graphite coated with pyrolytic carbon, glassy carbon, and graphite coated with glassy carbon is attached onto the surface of said cooling unit so that a surface emissivity of said cooling unit on a side of the exhaust unit becomes 0.5 (inclusive) to 1.0 (inclusive).

7. The heat treatment apparatus according to claim 4, further comprising:

a first temperature detection unit which is provided on said water cooling plate of said cooling unit, and detects a temperature of said water cooling plate;

a second temperature detection unit which is provided in a space region between the exhaust unit and said cooling unit, and detects a temperature of the space region; and a temperature monitoring unit which is connected to said first temperature detection unit and said second temperature detection unit, and performs temperature control in the vacuum vessel.

8. The heat treatment apparatus according to claim 7, wherein when the temperature detected by said first temperature detection unit rises to a first detection temperature determined in advance, said temperature monitoring unit controls a coolant supply unit to raise a flow rate of water supplied to said water cooling plate, thereby controlling the temperature of said water cooling plate constant.

9. The heat treatment apparatus according to claim 7, wherein when the temperature detected by said second temperature detection unit rises to a second detection temperature determined in advance, said temperature monitoring unit controls a power supply unit to stop power supply to the heating unit, thereby performing temperature control so as to prevent a further rise in temperature in the vacuum vessel.

10. The apparatus according to claim 1, wherein the first reflector is constructed to have a diameter which is equal to or greater than a diameter of the exhaust port, wherein the first reflector includes a first member and a second member, the second member is provided while being spaced apart from an opening of the exhaust port, and the first member is provided while being spaced apart from the second member, and wherein at least one of a plurality of reflector members which form said second reflector is constructed to intersect with a flow direction of the heat output from the heating unit.

11. The apparatus according to claim 1, wherein the vacuum vessel is constructed by a housing member capable of withstanding 1700° C., a surface of the housing member has a mirror finish, and the heating unit is capable of withstanding and providing the temperature.

12. The apparatus according to claim 1, wherein the member is arranged on a line connected between the heating unit and an opening of the exhaust port communicating with the exhaust unit, and the member prevents the heat output from the heating unit from flowing into the opening of the exhaust port.

\* \* \* \* \*